(12) United States Patent
Manohararajah et al.

(10) Patent No.: US 8,565,033 B1
(45) Date of Patent: Oct. 22, 2013

(54) METHODS FOR CALIBRATING MEMORY INTERFACE CIRCUITRY

(75) Inventors: Valavan Manohararajah, Scarborough (CA); Ivan Blunno, Woodbridge (CA); Ryan Fung, Mississauga (CA); Navid Azizi, Markham (CA)

(73) Assignee: Altera Corporation, San Jose, CA (US)

( * ) Notice: Subject to any disclaimer, the term of this patent is extended or adjusted under 35 U.S.C. 154(b) by 224 days.

(21) Appl. No.: 13/149,562

(22) Filed: May 31, 2011

(51) Int. Cl.
*G11C 7/00* (2006.01)

(52) U.S. Cl.
USPC .... 365/193; 365/129; 365/149; 365/189.011; 365/189.14; 365/189.05; 365/230.06; 365/233.1; 365/233.13; 365/233.16; 365/233.17

(58) Field of Classification Search
USPC ........ 365/129, 149, 189.011, 189.14, 189.05, 365/193, 230.06, 233.1, 233.13, 233.16, 365/233.17
See application file for complete search history.

(56) References Cited

U.S. PATENT DOCUMENTS

| | | | |
|---|---|---|---|
| 7,231,536 B1 * | 6/2007 | Chong et al. ................. | 713/400 |
| 7,475,315 B1 | 1/2009 | Natarajan et al. | |
| 8,117,483 B2 * | 2/2012 | Welker et al. ................ | 713/500 |
| 2007/0239379 A1 | 10/2007 | Newcomb et al. | |
| 2009/0031091 A1 | 1/2009 | Chang et al. | |
| 2010/0124131 A1 * | 5/2010 | Onishi ......................... | 365/193 |
| 2010/0180143 A1 | 7/2010 | Ware et al. | |
| 2010/0315119 A1 | 12/2010 | Welker et al. | |
| 2012/0176850 A1 * | 7/2012 | Do et al. ...................... | 365/193 |
| 2012/0229186 A1 * | 9/2012 | Baba ............................ | 327/161 |

FOREIGN PATENT DOCUMENTS

WO    WO 2011061875 A1 *  5/2011

OTHER PUBLICATIONS

Burney et al., U.S. Appl. No. 11/488,199, filed Jul. 17, 2005.
Dastidar et al., U.S. Appl. No. 12/463,358, filed May 8, 2009.
Fung et al., U.S. Appl. No. 13/149,583, filed May 31, 2011.

* cited by examiner

*Primary Examiner* — Fernando Hidalgo
(74) *Attorney, Agent, or Firm* — Treyz Law Group; Jason Tsai

(57) ABSTRACT

Integrated circuits may communicate with off-chip memory. Such types of integrated circuits may include memory interface circuitry that is used to interface with the off-chip memory. The memory interface circuitry may be calibrated using a procedure that includes read calibration, write leveling, read latency tuning, and write calibration. Read calibration may serve to ensure proper gating of data strobe signals and to center the data strobe signals with respect to read data signals. Write leveling ensures that the data strobe signals are aligned to system clock signals. Read latency tuning serves to adjust read latency to ensure optimum read performance. Write calibration may serve to center the data strobe signals with respect to write data signals. These calibration operations may be used to calibrate memory systems supporting a variety of memory communications protocols.

20 Claims, 16 Drawing Sheets

METHODS FOR CALIBRATING MEMORY INTERFACE CIRCUITRY

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

In a typical system, a programmable integrated circuit, memory devices, and other electronic components are mounted on a printed circuit board. The programmable integrated circuit includes memory interface circuitry that is used to relay data back and forth between the programmable integrated circuit and the memory devices (i.e., the memory interface circuitry is used to read data from and write data into the memory devices). When performing such memory read and write operations, the timing of control and data signals is critical.

Because programmable integrated circuits can be configured in many different ways and are installed on many different types of boards, the lengths of circuit board traces coupling the programmable integrated circuit to the memory devices can vary from one system to another. As a result, it is generally not possible to know in advance exactly how data and clock paths between a programmable integrated circuit and a given memory device will perform. In some systems, the data and clock paths may have one set of timing characteristics, whereas in other systems the data and clock paths may have a different set of timing characteristics.

Mismatch (or skew) between the data and clock paths may result in degraded setup and hold times. In modern high speed memory interface circuitry that use double data rate (DDR) transfers (i.e., a data transmission scheme in which data toggles on both rising and falling edges of the clock) a small amount of skew will result in faulty data transfer during read and write operations.

SUMMARY

Integrated circuits such as programmable integrated circuits having memory interface circuitry are provided. The memory interface circuitry may be used to communicate with off-chip memory devices (sometimes referred to as memory groups) that are mounted on a circuit board. The memory devices and the circuit board to which the memory devices are mounted may collectively be referred to as a memory module. Data and data strobe signals may be transmitted between the memory devices and the memory interface circuitry. The memory interface circuitry may provide system-level control signals (e.g., a reference clock signal, address signal, and command signal) to the memory devices.

During read operations, the memory interface circuitry may send appropriate system control signals to the memory module to read data out of the memory devices. The memory devices may output read data and associated data strobe signals. The read data may be latched using capture circuits and may be stored in read-synchronization buffers prior to outputting data in parallel.

During write operations, the memory interface circuitry may send appropriate system control signals to the memory module to write data into the memory devices. Consider a scenario in which a first memory device receives a read command signal before a second memory device receives the read command signal. The memory interface may be configured to send write data (DQ) and data strobe (DQS) signals to the first memory device before sending write DQ/DQS signals to the second memory device.

The memory interface circuitry may be calibrated at the startup of an integrated circuit to ensure reliable read and write operations. Memory interface circuitry calibration procedures may include read calibration, write leveling, read latency tuning, and write calibration. These steps are merely illustrative and are not intended to limit the scope of the present invention. If desired, these steps may be performed in any suitable order. In one suitable embodiment, read latency tuning need not be performed. In another suitable embodiment, read calibration is performed before write leveling, read latency tuning, and write calibration, whereas write leveling is performed before write calibration.

Read calibration may serve to calibrate a data strobe enable signal and to center the data strobe (DQS) signals with respect to the read data (DQ) signals. Calibrating the data strobe enable signals ensures that a properly gated DQS reaches the capture circuits (e.g., to filter out undesirable glitches in DQS). Centering read DQ/DQS involves aligning rising and falling edges of the DQS signals to the center of the read DQ windows to provide improved read margins (i.e., to provide equal setup and hold times) for the different memory devices. If desired, DQ/DQS calibration may also involve aligning DQS to the edges of the read DQ window.

Write leveling may serve to align the write data strobe signals associated with the different memory devices to the system clock (e.g., to align the rising edges of write DQS with the rising edges of the reference clock). Aligning the DQS signals during write operations may allow data to be properly written into the respective memory groups.

Read latency tuning involves configuring the read-synchronization (read-sync) buffers to optimize for performance. The read-sync buffers may be used to provide an adjustable read latency. A maximum round trip delay (e.g., the amount of time elapsed since the launch of a read command to the time read data signals arrive at the read-sync buffer associated with the memory device last to receive the read command) may be measured during read latency tuning. The read-sync buffers may be configured to provide a read latency that is at least one cycle greater than the maximum round trip delay, at least two cycles greater than the maximum round trip delay, etc.

Write calibration may serve to align the DQS signal to the center of the write DQ window to provide improved write margins (i.e., to provide equal setup and hold times) for the different memory devices.

During at least some of these calibration operations, delay may be introduced using programmable delay chains to provide 50 ps step delays (as an example), using delay-locked loops to provided phase delays (e.g., delays that are equal to any suitable fraction of a clock cycle), using buffer circuits to provide additional latency (e.g., delays that are equal to an integer multiple of a clock cycle), or using other configurable delay elements to provide desired tuning accuracy.

These calibration procedures may be used to calibrate memory systems supporting a variety of memory communications protocols such as double data rate (DDR), quad data rate (QDR), reduced-latency dynamic RAM, and other memory communications protocols.

Further features of the present invention, its nature and various advantages will be more apparent from the accompanying drawings and the following detailed description.

DETAILED DESCRIPTION

Embodiments of the present invention relate to integrated circuits that contain memory interface circuitry. The memory interface circuitry may be used to interface with off-chip memory such as random-access memory (RAM). The integrated circuits may be digital signal processors, microprocessors, application specific integrated circuits, or other suitable integrated circuits. With one suitable arrangement, the integrated circuits that communicate with memory are programmable integrated circuits such as programmable logic device integrated circuits or other programmable integrated circuits that contain programmable circuitry. The programmable circuitry can be programmed using configuration data. Programmable integrated circuits are typically operated in a diverse set of system environments. As a result, these integrated circuits tend to benefit from adjustable timing capabilities of the memory interface circuitry.

Figure 1:
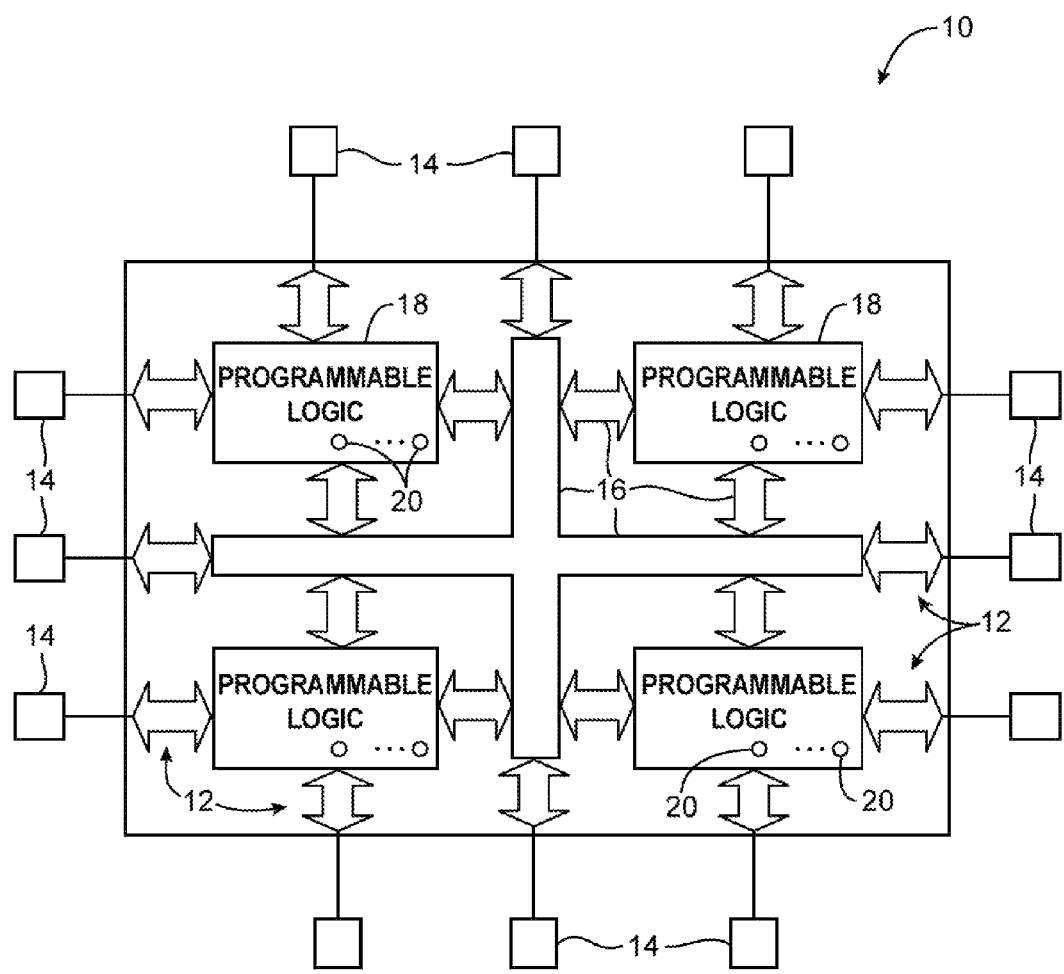
FIG. 1 is a diagram of an illustrative programmable integrated circuit in accordance with an embodiment of the present invention.

FIG. 1 shows a diagram of an illustrative programmable integrated circuit. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
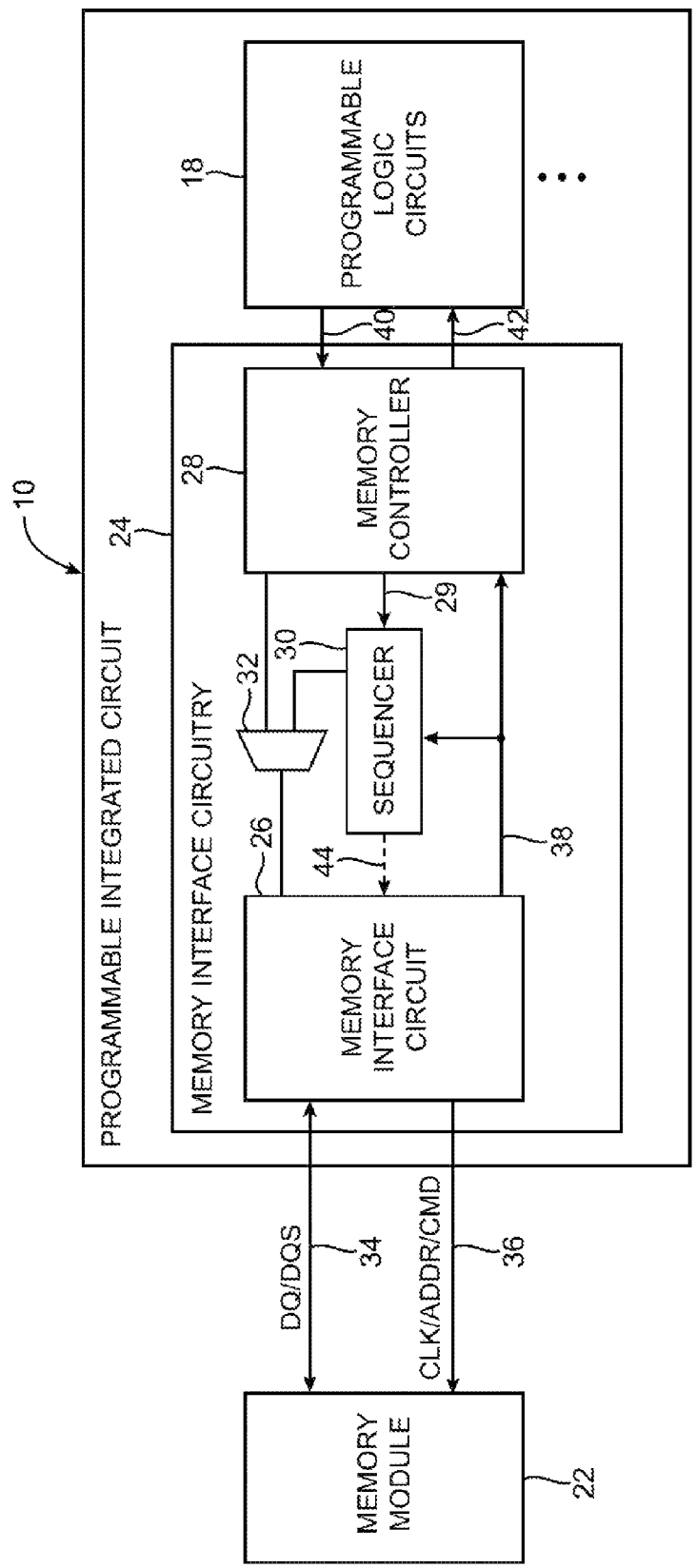
FIG. 2 is a diagram of illustrative memory interface circuitry in accordance with an embodiment of the present invention.

Device 10 may communicate with off-chip memory such as memory module 22. Memory module 22 may be a memory device sometimes referred to as a single in-line memory module (SIMM) or a dual in-line memory module (DIMM). Device 10 may be configured to communicate with at least two memory modules 22, at least four memory modules 22, etc. As shown in FIG. 2, device 10 may include memory interface circuitry 24 that serves to relay information between memory module 22 and logic circuits 18 that are internal to device 10. Memory interface circuitry 24 may include memory interface circuit 26, sequencer 30, memory controller 28, multiplexer 32, and other peripheral circuitry.

Memory interface circuit 26 may be coupled to memory module 22 through paths 34 and 36. During memory read operations, data (DQ) signals and data strobe (DQS) signals may be conveyed from memory module 22 to memory interface circuit 26 over path 34. During memory write operations, DQ/DQS may be conveyed from memory interface circuit 26 to memory module 22 over path 34.

During read and write operations, control signals such as clock CLK, address ADDR, and command CMD signals may be conveyed from memory interface circuit 26 to memory module 22 over path 36. Signal CLK may serve as a system reference clock (e.g., a reference clock to which the DQS signals, ADDRR, and CMD should be aligned). Signal CMD may be configured to a first value to initiate a read operation, to a second value to initiate a write operation, to a third value during normal operation, and to other values to initiate any desired operations. Signal ADDRR specifies the address (e.g., a selected bank address in a memory device) from which data is read out during read operations and the address to which data is written during write operations.

Memory interface circuit 26 may serve to perform desired data rate conversions and to generate signals that meet timing requirements specified by the memory protocol currently under use. Memory interface circuit 26 may output information gathered during read operations on output line 38. During memory interface calibration processes, read data and related signals may be routed to sequencer 30. During normal operation, read data and related signals may be routed to memory controller 28. Sequencer 30 may be coupled between memory interface circuit 26 and memory controller 28.

Memory interface circuit 26 may receive write data and related information from multiplexer 32. Multiplexer 32 may have a first input coupled to memory controller 28 and a second input coupled to sequencer 30. Multiplexer 32 may be configured to route signals from its first input to its output during normal operation, whereas multiplexer 32 may be configured to route signals from its second input to its output during memory interface calibration processes (e.g., memory interface circuit 26 may receive information from sequencer 30 during read/write calibration operations). Sequencer 30 arranged using the exemplary configuration of FIG. 2 may serve to calibrate the interface between memory module 22 and circuit 26 at the startup of device 10 (e.g., by sending control signals over line 44 to make timing adjustments in interface circuit 26).

Memory controller 28 may provide read data to programmable logic circuitry 18 over path 42, whereas programmable logic circuitry 18 may provide write data to memory controller 28 over path 40. Memory controller 28 may be configured to generate appropriate control signals corresponding to the memory protocol currently under use (e.g., circuit 28 may handle memory data management to address desired banks, rows, and columns and to perform memory refresh). Memory controller 28 may also serve to periodically request recalibration of memory interface circuit 26 by sending command signals over path 29. Generally, memory interface circuit 26 will be controlled predominately by sequencer 30 during memory interface calibration procedures, whereas memory interface circuit 26 will be controlled predominately by memory controller 28 during normal device operation.

The arrangement of FIG. 2 is merely illustrative and is not intended to limit the scope of the present invention. Integrated circuits other than programmable integrated circuits may include memory interface circuitry 24 that is used to communicate with one or more memory modules 22.

Figure 3:
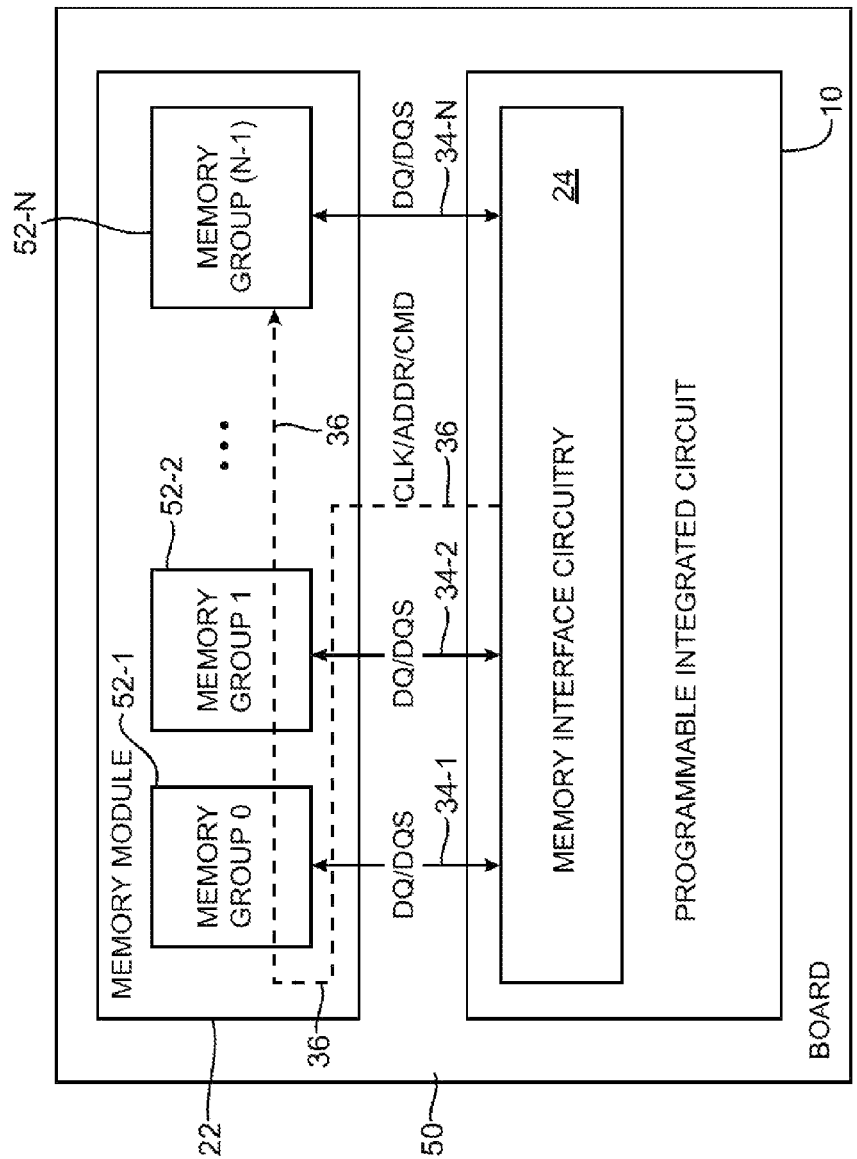
FIG. 3 is a diagram of illustrative memory interface circuitry operating in write leveling mode in accordance with an embodiment of the present invention.

As shown in FIG. 3, integrated circuit 10, memory module 22, and other circuit components (e.g., integrated circuit chips, surface mount components, etc.) may be mounted on a circuit board (e.g., printed circuit board 50). Board components may be interconnected by conductive traces and packaging (e.g., sockets into which integrated circuits are mounted) formed on board 50.

Memory module 22 may include a series of memory devices, at least some of which is sometimes referred to as a memory group. For example, memory module 22 may include first memory group 52-1, second memory group 52-2, . . . , and $N^{th}$ memory group 52-N. Memory module 22 may include at least nine memory groups (as an example). Each of the memory groups may contain hundreds or thousands of memory cells (e.g., RAM cells). The memory groups may communicate with memory interface circuitry through respective signal paths. For example, first memory group 52-1 may communicate with circuitry 24 by sending data and data strobe signals (DQ/DQS) over path 34-1, second memory group 52-2 may communicate circuitry 24 by sending DQ/DQS over path 34-2, etc.

In general, memory access operations are not synchronized with system-level control signals CLK/CMD/ADDRR. As a result, the DQ signals that are received from the memory groups are not phase aligned with any known clock signal in device 10. It is therefore necessary to provide DQS clock signals with the DQ signals, so that the DQS clocks can be used to establish proper timing relationships when processing the DQ signals. For example, during a read operation, memory interface circuitry 24 uses the DQS clocks in capturing data as it is transmitted over paths 34 from memory 22 (see, e.g., FIG. 2). In general, the operation of each memory group is somewhat independent, so memory module 22 generates a DQS signal for each of the memory groups.

The DQS signals for the different memory groups are generally not phase aligned with each other (e.g., skew may be present among the DQS signals). For example, although the DQS signal for a first memory group is edge-aligned with the DQ signals in the first memory group, the DQS signal for the first memory group and the seventh memory group (as an example) need not be in phase with each other.

Memory interface circuitry 24 may send control signals to the memory groups through path 36. Memory module 22 of FIG. 3 may be a type of memory module that exhibits inherent non-zero layout skew (e.g., the control signals on path 36 may arrive at each of the memory groups at different times). For example, because of the way path 36 is routed, the control signals on path 36 may arrive first at memory group 52-1 and then arrive at each subsequent memory group after some delay.

During read operations, appropriate control signals may be sent over path 36 to direct the memory groups to output read data. Read data may be generated from the memory groups at different times depending on when control signals CLK/CMD/ADDR arrive at a particular memory group. For example, memory group 52-1 may output read data before subsequent memory group 52-2, memory group 52-2 may output read data before subsequent memory group 52-3, memory group 52-3 may output read data before subsequent memory group 52-4, etc. Memory interface circuitry 24 may therefore receive read data from the different memory groups at staggered times. Memory interface circuitry 24 may include buffer circuitry that can be used to equalize the skew among the different memory groups.

During write operations, care needs to be taken when sending the DQ/DQS signals to the respective memory groups. Device 10 may, for example, operate in a write leveling mode in which the DQ/DQS signals are sent to the respective memory groups at predetermined staggered times. For example, DQ/DQS may be sent over path 34-1 to memory group 52-1 at a first point in time, whereas DQ/DQS may be sent over path 34-2 to subsequent memory group 52-2 at a second point in time that is later than the first point in time (e.g., DQ/DQS for each subsequent memory group may be sent after some adjustable amount of delay). Sending DQ/DQS from memory interface circuitry 24 to the memory groups using this write leveling approach ensures that the DQ/DQS signals and the control signals arrive synchronized (e.g., that the DQ/DQS signals and the CLK signal are phase aligned).

Figure 4:
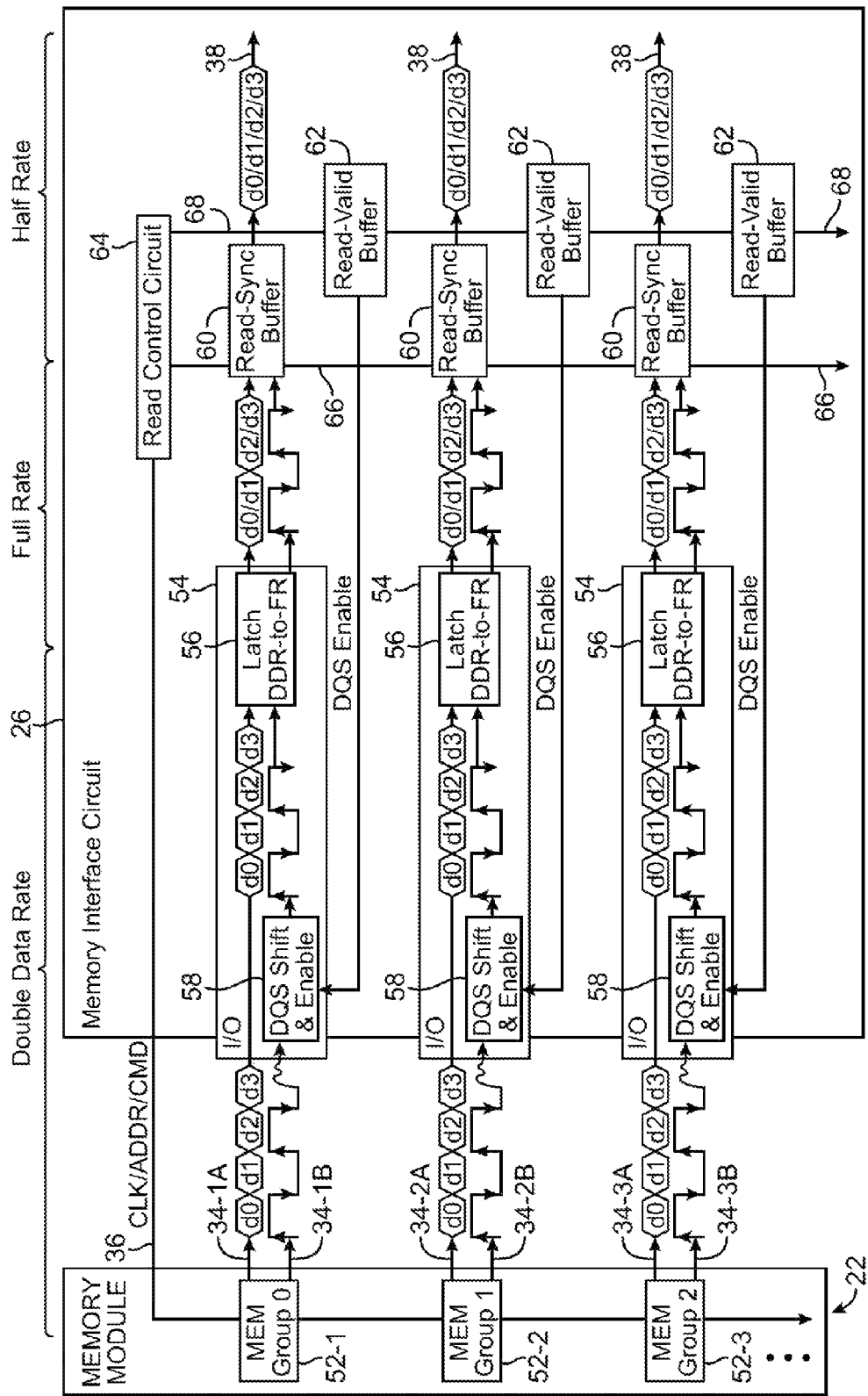
FIG. 4 is a diagram showing an exemplary memory read operation in accordance with an embodiment of the present invention.

FIG. 4 is a diagram showing an illustrative signal flow during read operations. As shown in FIG. 4, the memory groups on memory module 22 may send read signals to corresponding memory interface input-output (I/O) circuits 54 in memory interface circuit 26. For example, memory group 52-1 may send DQ signals over line 34-1A to a first I/O circuit 54 and may send DQS signals over line 34-1B to the first I/O circuit 54. Similarly, memory group 52-2 may send DQ signals over line 34-2A to a second I/O circuit 54 and may send DQS signals over line 34-2B to the second I/O circuit 54, and so on.

System control signals CLK/ADDR/CMD may be conveyed to the memory groups over path 36. As shown in FIG. 4, memory group 52-1 may output DQ/DQS signals before any other memory group, because group 52-1 receives the system control signals before the other memory group. Similarly, memory group 52-2 may output DQ/DQS signals before all subsequent memory groups (i.e., before memory groups 52-3, 52-4, . . . , 52-N). Memory module 22 may therefore generate read data from the memory groups at different points in time.

Memory interface I/O circuit 54 may include latching circuit 56 and DQS shift and enable circuit 58. Latching circuit 56 may have a first input that receives DQ signals from an associated memory group and a second input that receives DQS signals from the associated memory group through DQS shift and enable circuit 58. Circuit 58 may serve to align the DQS signals to the DQ signals and may also serve to gate the DQS signals so that any glitches present before or after the DQS burst are eliminated.

DQS shift and enable circuit 58 may receive a DQS_Enable signal from an associated read-valid buffer (sometimes referred to as a first-in-first-out circuit) 62. Buffer 62 may be coupled to a control circuit such as read control circuit 64. Read control circuit 64 may be used to generate system control signals CLK/ADDR/CMD over path 36 and may also be used to provide an enable signal having a pulse width that is approximately equal to the desired DQS burst length. The enable signal may be provided to each read-valid buffer 62 over path 68. Buffer 62 may delay the enable signal by some adjustable amount to generate a corresponding DQS_Enable signal.

Latching circuit 56 may serve to latch the DQ signals (received at its first input) at the rising and falling edges of the DQS signals (received at its second input). Latching circuit 56 of this type may therefore sometimes be referred to as a double-edge-triggered data capture circuit. The DQ signals received by latching circuit 56 toggle at both rising and falling edges of DQS. Data transfer of this type may sometimes be referred to as double data rate (DDR) transmission.

Latching circuit 56 may have first and second outputs. DQ signals transmitting at full data rate (FR) may be provided at the first output of latching circuit 56. DQS signals provided at the second output of latching circuit 56 may be a substantially unaltered version of the DQS signals received at the second input of latching circuit 56. The DQ signals generated at the first output of latching circuit 56 may be a two-bit parallel output signal toggling at the rising edges of DQS (as an example). Latching circuit 56 that is used to capture and output data in this arrangement may sometimes be referred to as a DDR-to-FR capture circuit.

Memory interface I/O circuit 54 may be coupled to an associated read-synchronization buffer 60. In particular, read-sync buffer 60 may have a first input coupled to the first output of latching circuit 56 and a second input coupled to the second output of latching circuit 56. Buffer 60 may, for example, have an output on which a four-bit parallel output signal toggling at every other rising edge of DQS received at its second input is provided (e.g., buffer 60 may output data at half data rate (HR)). The output of buffer 60 may be coupled to path 38 (see, e.g., FIG. 2). Buffer 60 that is used to delay and output data in this way may sometimes be referred to as a FR-to-HR buffer circuit.

Buffer 60 may be coupled to read control circuit 64. Read control circuit 64 may be used to synchronize buffers 60 so that read data is output simultaneously in parallel (e.g., by sending control signals to read-sync buffers 60 over line 66). Read control circuit 64 may include a read latency counter that takes into account a maximum round trip delay. The maximum round trip delay may be equal to the amount of time elapsed since the launch of a read command (on path 36) to the time DQ signals arrive at buffer 60 associated with last memory group 52-N (i.e., the memory group that is last to receive the read command). Data is read out from buffers 60 in parallel when the counter exceeds a predetermined threshold. The predetermined threshold may be at least equal to or greater than the maximum round trip delay. Delaying the read-sync buffers in this way ensures that the data from the memory groups has successfully been stored at the read-sync buffers prior to readout.

Figure 5:
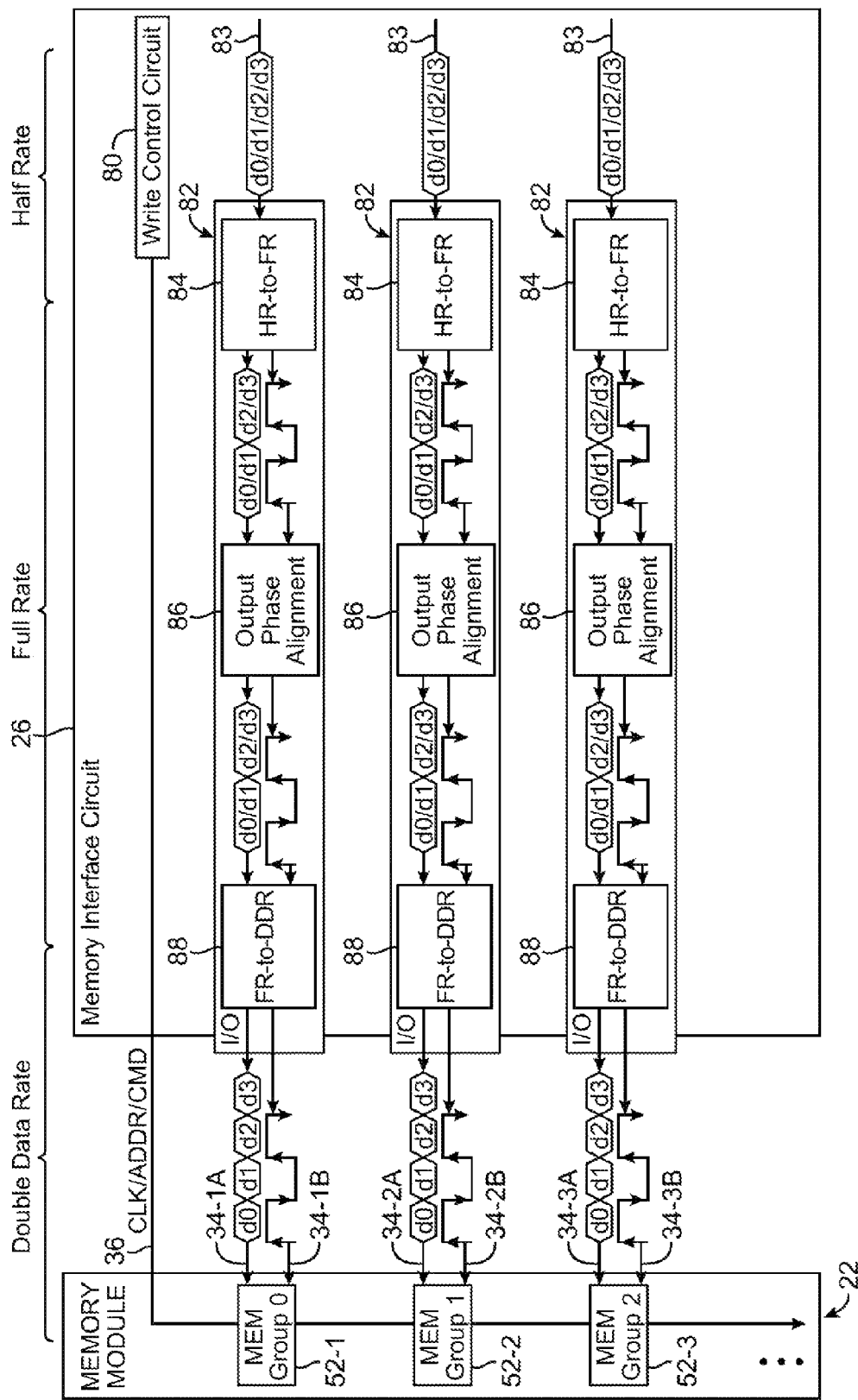
FIG. 5 is a diagram showing an exemplary memory write operation in accordance with an embodiment of the present invention.

FIG. 5 is a diagram showing an illustrative signal flow during write operations. As shown in FIG. 5, a control circuit such as write control circuit 80 may send control signals CLK/ADDR/CMD to the different memory groups in module 22 over path 36. Memory interface circuit 26 may include memory interface I/O circuits 82 each of which is associated with a respective one of the different memory groups.

Write I/O circuit 82 may include half data rate to full data rate (HR-to-FR) latching circuit 84, output phase alignment circuit 86, and full data rate to double data rate (FR-to-DDR) latching circuit 88 coupled in series. Circuit 84 may receive DQ signals toggling at half data rate from path 83. Path 83 may be coupled to the output of multiplexer 32 (see, e.g., FIG. 2). Circuit 84 may generate at its first output DQ signals toggling at full data rate and may generate at its second output corresponding DQS signals.

Output phase alignment circuit 86 may receive the DQ/DQS signals from circuit 84. Output phase alignment circuit 86 may serve to shift the DQ/DQS signals so that DQ/DQS are phase aligned to provide optimum setup and hold times. Circuit 86 may also be used to introduce delay (skew) to DQ/DQS so that DQ/DQS and the system control signals arrive synchronized (aligned) at a corresponding memory group (i.e., for write leveling purposes).

Latching circuit 88 may receive the DQ/DQS signals from circuit 86. Circuit 88 may feed DQ/DQS signals to the corresponding memory group. For example, first latching circuit 88 may have a first output terminal coupled to line 34-1A and a second output terminal coupled to line 34-1B. Second latching circuit 88 may have a first output terminal coupled to line 34-2A and a second output terminal coupled to line 34-2B, and so on. Latching circuit 88 may be used to generate at its first output DQ signals toggling at double data rate (e.g., to generate DQ signals toggling at the rising and falling edges of the DQS signals provided at its second output).

In general, circuit 82 associated with memory group 52-1 will output DQ/DQS first, because memory group 52-1 will be first to receive the system control signals. Circuit 82 associated with memory group 52-N will output DQ/DQS last, because memory group 52-N will be last to receive the system control signals (as an example). Outputting data to the memory groups at different times in this way is characteristic of the write leveling mode.

At device startup, the read memory interface I/O circuits 54 and the write memory interface I/O circuits 82 may not be calibrated properly to communicate with memory module 22 and may result in unreliable reads and writes (state 100). It may therefore be desirable to perform a series of read and write calibration operations to ensure that critical timing constraints are met to satisfy design criteria.

Figure 6:
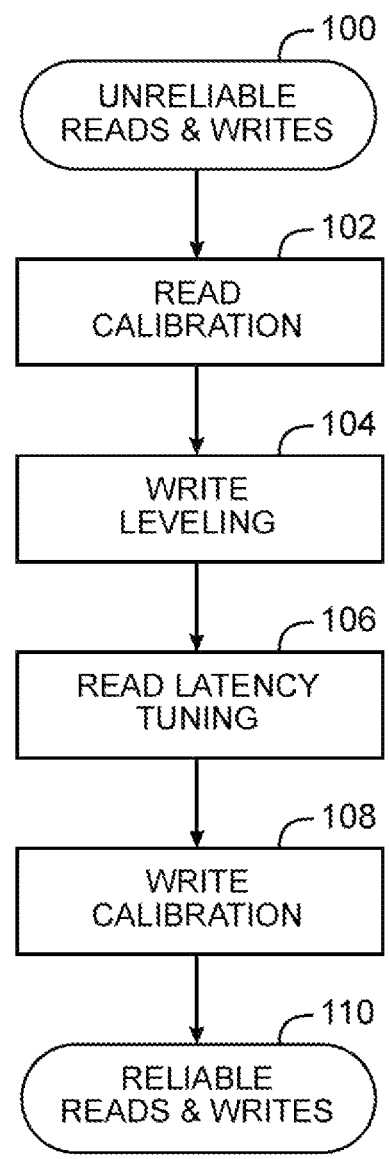
FIG. 6 is a flow chart of illustrative steps involved in calibrating memory interface circuitry in accordance with an embodiment of the present invention.

As shown in FIG. 6, calibration procedures may include read calibration (step 102), write leveling (step 104), read latency tuning (step 106), write calibration (step 108), and other suitable calibration steps. Step 106 may be an optional calibration step suitable for use with certain types of memory systems. These steps are merely illustrative and are not intended to limit the scope of the present invention. If desired, step 106 may be performed prior to step 104.

Performing such types of calibration procedures may ensure that device 10 operates properly to exhibit reliable reads and writes (state 110). During at least some of these calibration steps, delay may be introduced using programmable delay elements (e.g., programmable delay chains), delay-locked loops (DLLs), buffers, and other types of adjustable delay circuits. For fine timing adjustments, programmable delay chains may, for example, be used to provide 50 ps step delays. For coarser timing adjustments, configurable delay-locked loops may be used to provide desired phase delays (e.g., delays that represent some fraction of a clock cycle), whereas adjustable buffers may be used to provide additional clock latency (e.g., delays that represent some multiple of a clock cycle).

Figure 7:
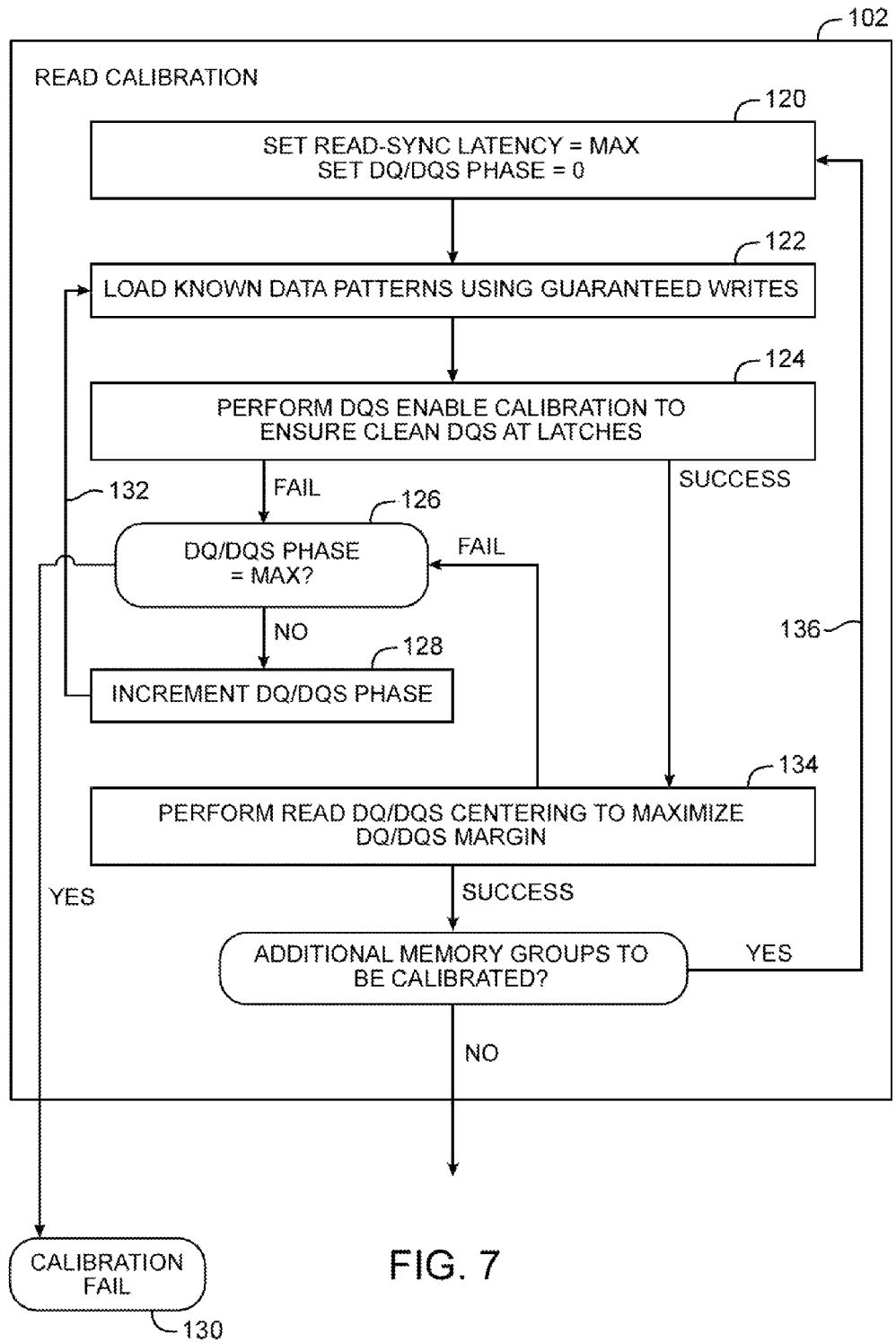
FIG. 7 is a flow chart of illustrative steps involved in performing read calibration in accordance with an embodiment of the present invention.

FIG. 7 is a flow chart showing illustrative steps involved during read calibration 102. At step 120, read-sync buffer 60 associated with a first memory group may be configured to provide a maximum latency (e.g., buffer 60 is set to hold read data for as long as possible without outputting new data), whereas the DQ/DQS phase and delay setting is set to zero.

At step 122, known data patterns may be loaded into at least the first memory group using a guaranteed write operation. The guaranteed write operation may involve repeatedly toggling DQS with DQ set to some constant value (e.g., DQ is fixed to "0" or fixed to "1") and repeatedly issuing a write command. Loading data using this approach ensures that DQ-to-DQS requirements are satisfied (e.g., setup and hold times are met if DQ is constant) and ensures that DQS-to-CLK requirements are satisfied by continuing to toggle DQS over an extended period of time (to allow DQS and CLK to be approximately aligned for a portion of time during the extended period). For example, guaranteed writes may be used to write a constant burst of zeroes to one memory bank in the first memory group and to write a constant burst of ones to another memory bank in the first memory group.

In another suitable arrangement, the known data patterns (sometimes referred to as training patterns) may be loaded into the memory groups using a slower clock speed. Lowering the clock speed may reduce the impact of skew and DQ/DQS misalignment to facilitate data loading operations. In addition, some memory standards offer guaranteed write mechanisms that are capable of loading a predefined training pattern into the memory groups. Such guaranteed write mechanisms may also be used, if desired.

At step 124, DQS enable calibration may be performed to ensure clean DQS signals at the second (clock control) input of latching circuit 56. DQS enable calibration may or may not succeed at the current setting (i.e., the current read-sync latency and DQ/DQS phase setting). Some memory protocols have particular preamble requirements. If these preamble requirements are not satisfied, DQS enable calibration may not succeed. If step 124 fails, DQ/DQS phase may be increased to delay DQ/DQS by an additional 45° in phase (steps 126, 128, and 132). Changing DQ/DQS phase may help satisfy the preamble requirements. If desired, at step 128 phase may be incremented by any desired amount (e.g., by at least 30°, at least 60°, at least 90°, at least 180°, etc.).

In scenarios in which step 124 fails and the DQ/DQS phase cannot be increased any further, calibration will have failed (state 130), indicating that the guaranteed write operation was not able to successfully load the known data pattern into the first memory group.

If step 124 succeeds, read DQ/DQS centering may be performed to maximize DQ/DQS margin (e.g., step 134, to provide equal amounts of setup and hold time). If there are additional memory groups to be calibrated, processing may loop back to step 120 to perform read calibration on a subsequent memory group, as indicated by path 136.

Figure 8:
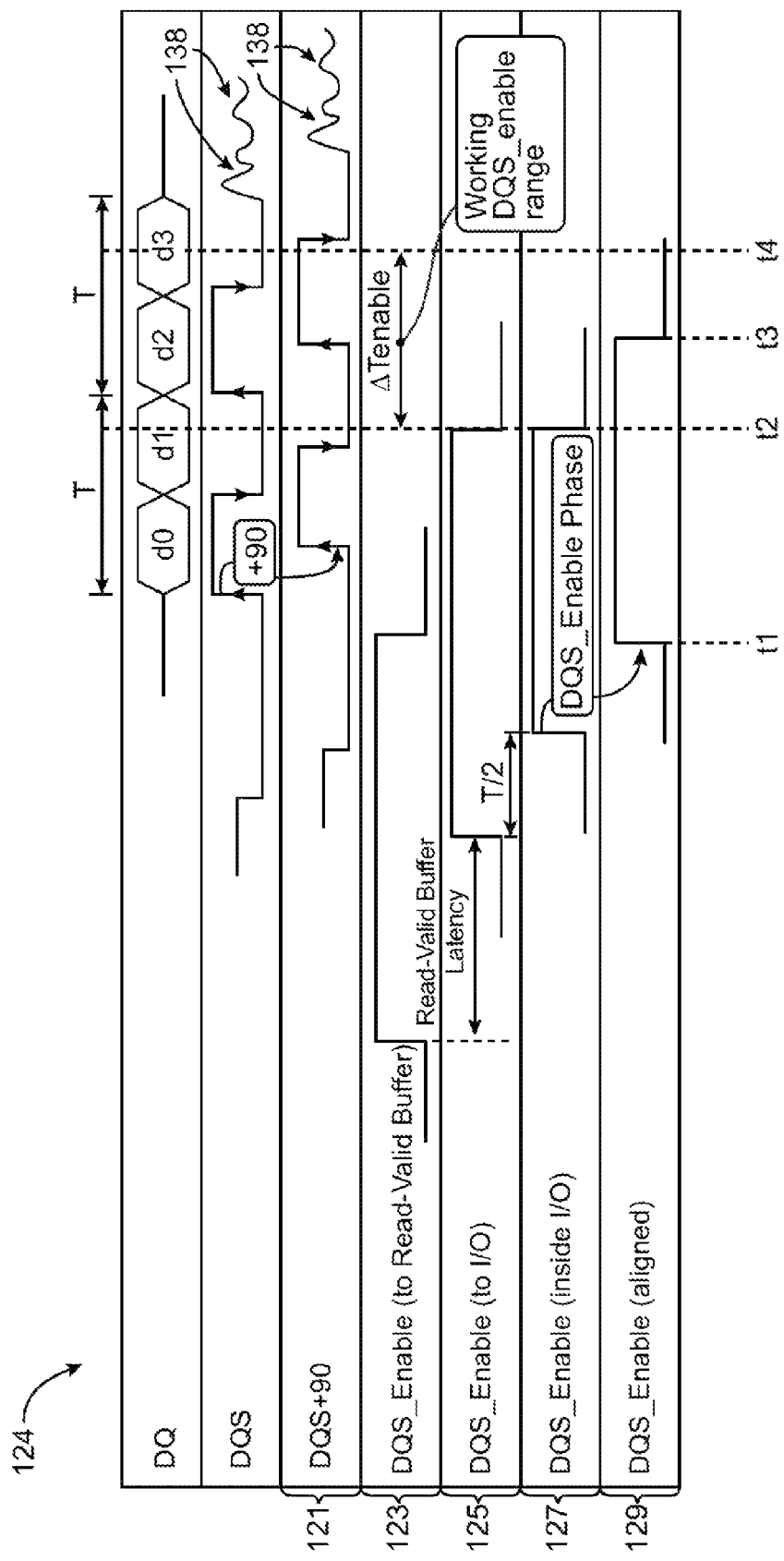
FIG. 8 is an exemplary timing diagram during data strobe enable calibration in accordance with an embodiment of the present invention.

FIG. 8 is a timing diagram showing illustrative signal behavior during DQS enable calibration (step 124 of FIG. 6). As shown in FIG. 8, DQ and DQS signals generated from memory are edge aligned (i.e., the data signals toggle at the rising and falling edges of DQS). Signal DQS may clock at a frequency that is equal the reciprocal of clock period T. Circuit 58 may be used to shift DQS by 90° to enable latching circuit 56 to properly capture the DQ signals (see, e.g., waveform 121).

As illustrated in FIG. 8, glitches 138 may be present in the DQS signals. These spurious signals may be filtered using a DQS_Enable signal. Read control circuit 64 may feed signal DQS_Enable to read-valid buffer 62 (see, e.g., waveform 123). DQS_Enable generated by read control circuit 64 may have a pulse width that is at least equal to the period of time during which valid DQ is being transmitted. DQS_Enable may be delayed according to an adjustable read-valid buffer latency period (see, e.g., waveform 125). DQS_Enable may be shortened using circuit 58 by a half clock cycle T/2 (see, e.g., waveform 127).

The rising edge (at time t1) of DQS_Enable may asynchronously ungate DQS (i.e., allowing DQS to pass through circuit 58 to asynchronously enable latching circuit 56), whereas the first falling edge of DQS following the last falling edge of DQS_Enable may synchronously disable latching circuit 56. It may therefore be desirable to place the falling edge of DQS_Enable (at time t3) within working DQS enable range ΔTenable (see, e.g., waveform 129, to place the falling edge of DQS_Enable between the second to last DQS falling edge at time t2 and the last DQS falling edge at time t4). In this example, range ΔTenable is defined by start time t2 and end time t4.

Centering DQS_Enable within working range ΔTenable can be achieved by applying an appropriate amount of read-valid buffer latency, by selecting an appropriate clock phase using DLLs in circuit 58, and by providing a appropriate amount of delay using programmable delay elements in circuit 58 (as examples).

Figure 9:
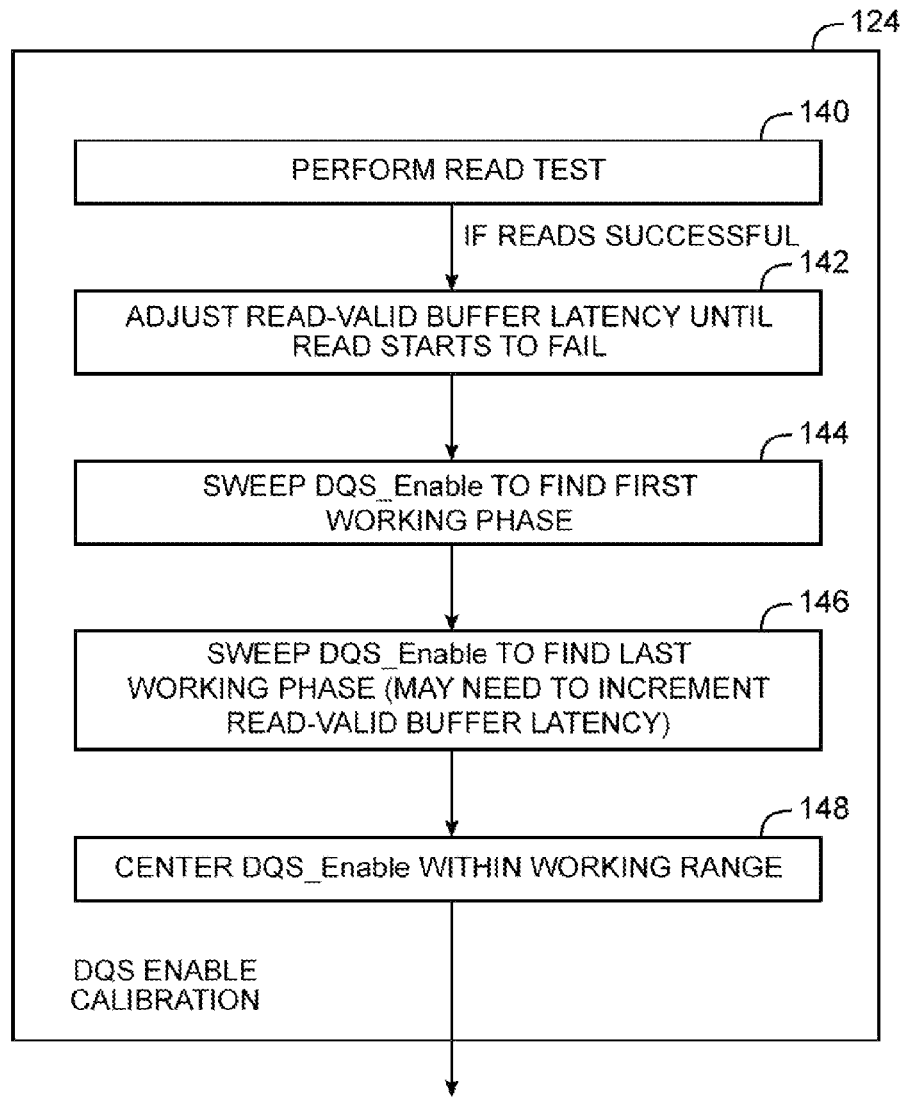
FIG. 9 is a flow chart of illustrative steps involved in performing data strobe enable calibration in accordance with an embodiment of the present invention.

FIG. 9 summarizes illustrative steps involved in DQS enable calibration 124. At step 140, several read tests may be performed until at least one bit of data can be successfully read from a selected memory group. At step 142, the read-valid buffer latency is adjusted until reads start to fail.

At step 144, DQS_Enable phase and delay settings may be swept to find a left edge for working window ΔTenable (e.g., until the falling edge of DQS_Enable is approximately aligned to the second to last falling edge of shifted DQS). At step 146, DQS_Enable phase and delay settings may be swept to find a right edge for working window ΔTenable (e.g., until the falling edge of DQS_Enable is approximately aligned to the last falling edge of shifted DQS). Read-valid buffer latency settings may be adjusted in order to find the last working phase. Sweeping both DQS_Enable phase (e.g., by fractions of a clock cycle) and delays (e.g., by 50 ps steps) in this way can accurately determine the left and right edges of the working window. At step 148, DQS_Enable may be centered within the working window.

In scenarios in which DQS_Enable is late (e.g., when the falling edge of DQS_Enable occurs after the last valid falling edge of shifted DQS) and glitches 138 are present, the last working phase may be determined erroneously.

Figure 10:
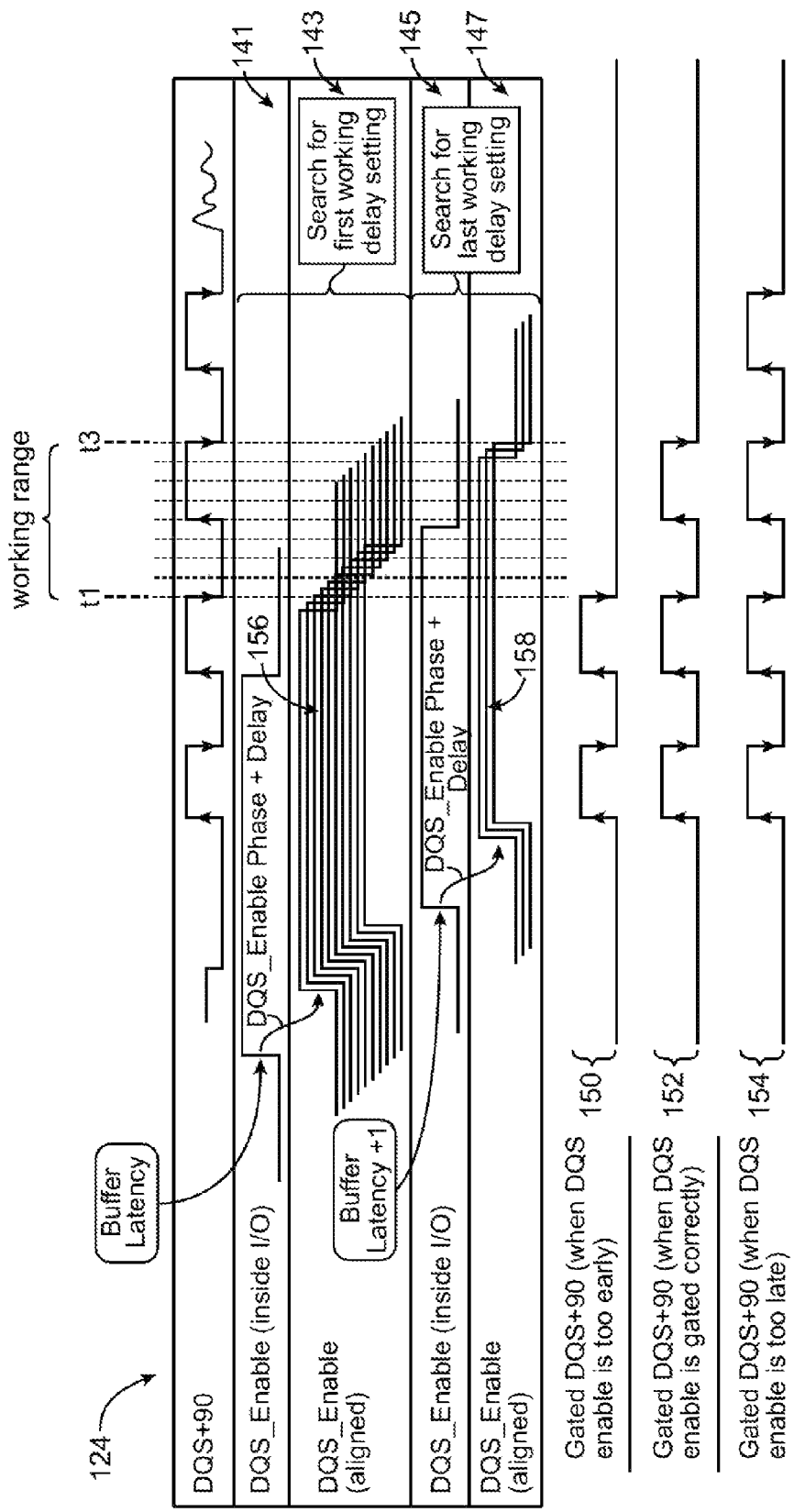
FIG. 10 is an exemplary timing diagram during data strobe enable calibration in accordance with an embodiment of the present invention.

FIG. 10 is a timing diagram showing another suitable arrangement for DQS enable calibration 124. It may be desirable to trigger the synchronous disabling of latching circuit 56 based on the second to last falling edge of shifted DQS (DQS+90°). This aligns the first working edge (e.g., a left edge defined by the falling edge of DQS_Enable that is delayed using a first working delay setting) at the third to last falling edge of DQS (at time t1) and aligns the last working edge (e.g., a right edge defined by the falling edge of DQS_Enable that is delayed using a last working delay setting) to the second to last falling edge of DQS (at time t3).

Triggering the synchronous disabling using this approach allows the user to determine whether DQS_Enable is too early (i.e., DQS_Enable falling edge is before the first working edge), whether DQS_Enable is gating DQS correctly (i.e., DQS_Enable falling edge is after the first working edge and before the last working edge), or whether DQS_Enable is too late (i.e., DQS_Enable falling edge is after the last working edge).

In the example of FIG. 10, if four data bits are read out, DQS_Enable is too early (see, e.g., waveform 150). If six data bits are read out, DQS_Enable is gating DQS correctly (see, e.g., waveform 152). If eight data bits are read out, DQS_Enable is too late (see, e.g., waveform 154). Determining the working DQS enable range in this way enables the user to correctly locate the last working phase whether or not glitches are present in DQS.

At step 141, read-valid buffer latency is adjusted so that DQS_Enable is outside the working range (e.g., the time period from t1 to t3). At step 143, DQS_Enable phase and delay is swept to find the first working delay setting (i.e., a first setting that configures circuit 58 to delay DQS_Enable so that the falling edge of DQS_Enable is aligned to the start time of the working range), as indicated by waveform 156 (e.g., to find the earliest delay setting that results in two missing data bits when DQS_Enable is too early). At step 145, the read-valid buffer latency is increased by one clock cycle (as an example) to help find the last working delay setting (i.e., a second setting that configures circuit 58 to delay DQS_Enable so that the falling edge of DQS_Enable is aligned to the end time of the working range). At step 147, DQS_Enable phase and delay is swept to find the last working delay setting, as indicated by waveform 158 (e.g., find the latest delay setting that results in the correct number of data bits when DQS_Enable is gating DQS properly). In a subsequent step, DQS_Enable can then be centered within the working range by delaying DQS_Enable using a calibrated delay setting that is equal to an average of the first and last delay settings (as an example).

Figure 11:
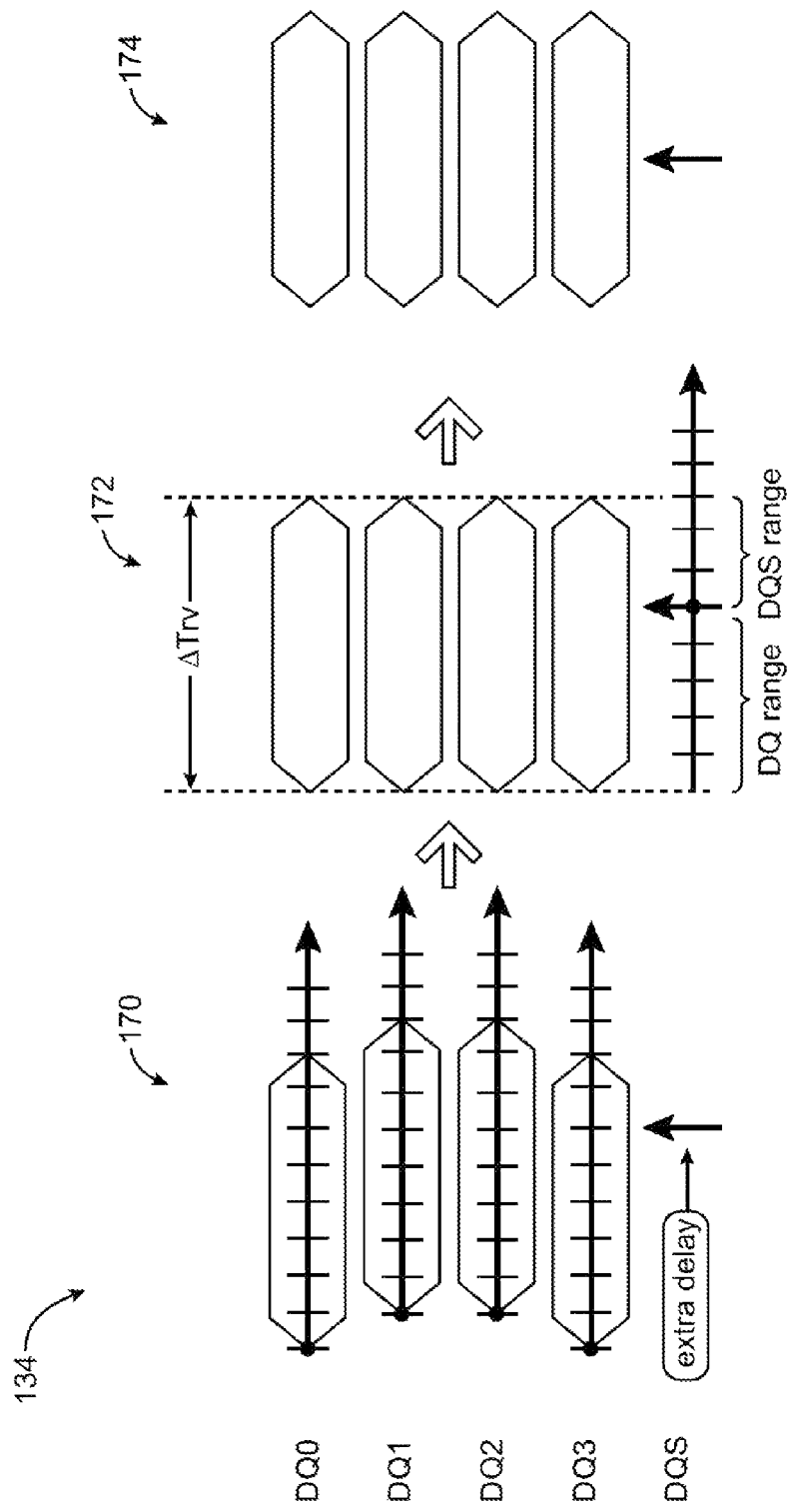
FIG. 11 is a diagram showing illustrative steps involved in performing read data strobe centering in accordance with an embodiment of the present invention.

FIG. 11 is a diagram showing illustrative steps involved in performing read DQ/DQS centering (step 134 of FIG. 7). Read DQ/DQS centering may serve to place the rising edges of DQS at the center of each valid DQ window (i.e., to maximize DQ and DQS setup and hold margins).

Diagram 170 shows a first snapshot in time before DQ/DQS centering has been performed. As shown in diagram 170, the DQ signals may be offset in time with respect to one another (e.g., DQ0 and DQ1 are offset by one delay step). Signal DQS is also not placed at the center of each DQ window. Extra delay may be applied to DQS to provide additional "headroom" for DQ adjustments so that only the DQ signals will have to be delayed when centering DQ/DQS. Only delaying DQ may be desirable as DQS_Enable has already been calibrated to the current DQS setting determined from step 124.

Diagram 172 shows a second snapshot in time after the DQ signals have been equalized. For example, DQ0 and DQ3 may be delayed by one delay step so that DQ0-DQ4 are aligned to a common read data valid window ΔTrv. During a first time period, the DQ signals may be delayed to determine the DQ range (e.g., to measure a setup time). During a second time period, the DQS signals may be delayed to determine the DQS range (e.g., to measure a hold time). Signals DQS and DQS_Enable may be shifted together to ensure proper DQS gating. In the example of FIG. 11, the measured DQ range is equal to five delay steps, whereas the measure DQS range is equal to three delay steps. DQS may be shifted back to its original position (i.e., its position in diagram 170) after determining the DQS range.

Diagram 174 shows a third snapshot in time after DQ/DQS centering has been performed. In this example, each of signals DQ0-DQ3 have been delayed by one additional delay step so that the DQ range and the DQS range are equal (e.g., so that DQS is centered within ΔTrv).

It may be desirable to reduce the amount of DQS headroom to minimize DQS jitter. In scenarios in which the DQS headroom is insufficient (i.e., if DQS is to the left of the center of ΔTrv), it may be necessary to delay DQS to center DQS within ΔTrv. If such changes are made, DQS_Enable may be delayed accordingly. If desired, DQS enable calibration procedures may be performed again to ensure proper DQS gating.

In another suitable arrangement, DQ/DQS centering 134 may be performed before DQS enable calibration 124. In such configurations, DQS may be ungated throughout DQ/DQS centering operations to allow measurement of DQ/DQS margins without having to control DQS_Enable timing.

Figure 12:
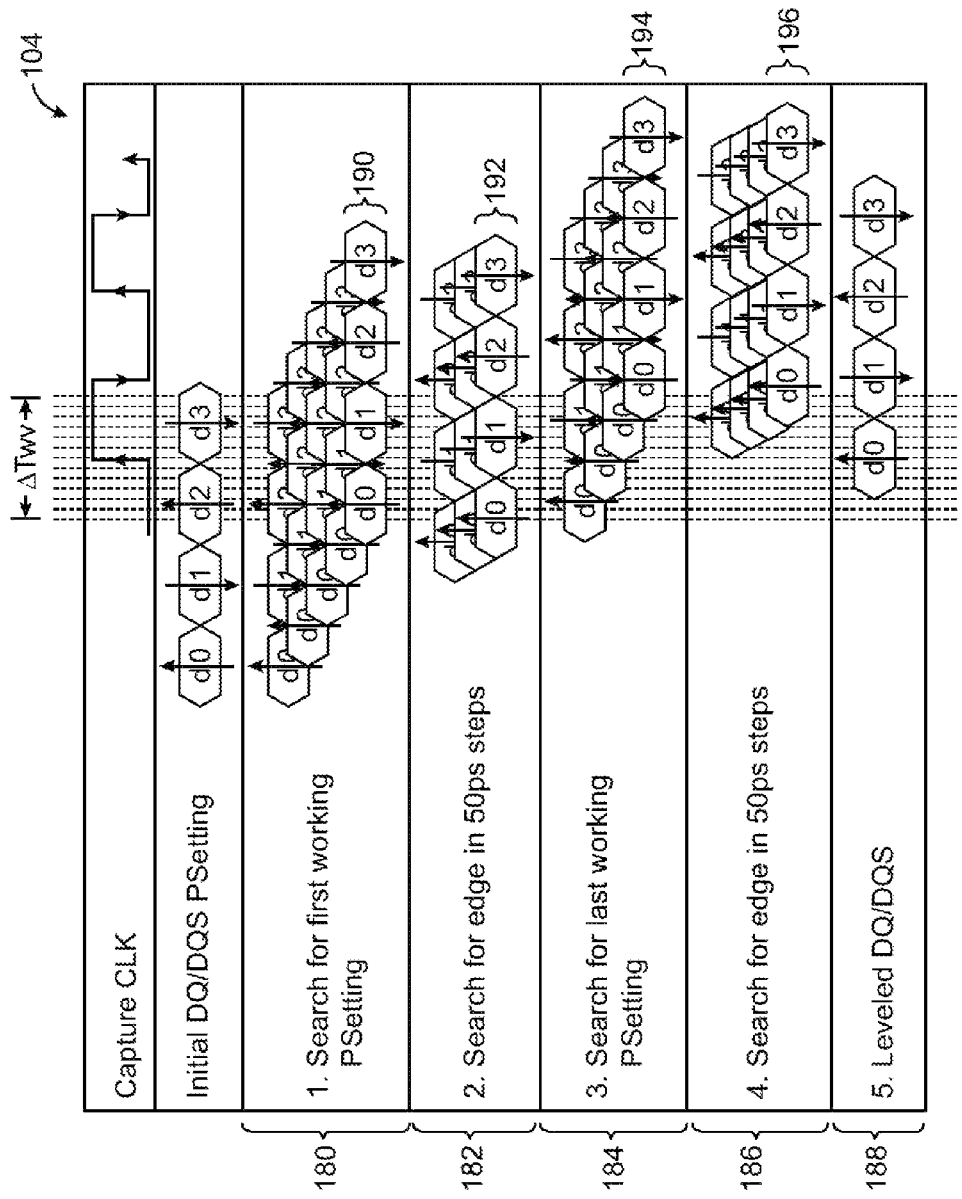
FIG. 12 is a timing diagram showing illustrative steps involved in performing write leveling in accordance with an embodiment of the present invention.

FIG. 12 is a diagram showing steps involved in performing write leveling (step 104 in FIG. 6). Capture CLK represents the system clock signal arriving at a given memory group. Data may be properly written into the memory group if DQS clocks high during a write data valid window ΔTwv surrounding a positive edge of signal CLK (or if DQS clocks low during a write data valid window surrounding a negative clock edge of CLK). Write data valid window may be defined by a start time and an end time. It may be desirable to align the rising edges of DQS with the rising edges of CLK and to align the falling edges of DQS with the falling edges of CLK. In the example of FIG. 12, it is assumed that DQ/DQS margins meet timing constraints (e.g., that data setup and hold times are sufficient).

The initial DQ/DQS phase setting as shown in FIG. 12 will not provide a successful write because DQS associated with d0 is not within ΔTwv. At step 180, DQ/DQS phase may be swept to search for the first working phase (e.g., incrementing by quarter clock cycle phase steps). Data stream 190 may correspond to a first working phase setting, because this is the earliest phase setting for which DQS associated with d0 lies within ΔTwv.

At step 182, the first working phase setting is decreased by one, and DQ/DQS is increased by 50 ps steps (as an example) to find the left edge of window ΔTwv. Searching the limits of ΔTwv by adjusting phase and delay settings provides fine timing resolution for greater calibration accuracy. Data stream 192 may correspond to the first working delay setting (e.g., a setting for which DQS associated with d0 is aligned to the start time of the write data valid window).

At step 184, DQ/DQS phase may be swept to search for the last working phase. Data stream 194 may correspond to the last working phase setting, because this is the earliest phase setting for which DQS associated with d0 lies after ΔTwv. At step 186, the last working phase setting is decreased by one, and DQ/DQS is increased by 50 ps steps to find the right edge of window ΔTwv. Data stream 196 may correspond to the last working delay setting (e.g., a setting for which DQS associated with d0 is aligned to the end time of the write data valid window).

At step 188, DQ/DQS may be centered within ΔTwv (e.g., DQ/DQS is shifted according to an intermediate delay setting that is equal to the average of the first and last working delay settings) so that DQS associated with d0 is substantially aligned with the first rising clock edge of system CLK. The exemplary numerical figures described in connection with FIG. 12 are merely illustrative. If desired, the phase steps may be any suitable fraction of a clock cycle and the delay steps may greater than 50 ps or less than 50 ps.

In scenarios in which write data valid window ΔTwv is less than a phase step, iterating over phase settings may not succeed in finding a first working phase setting. In such scenarios, it may be necessary to search for the left and right edges by iterating through each phase setting using 50 ps steps.

In scenarios in which skew between CLK and DQS is significant, no available phase setting and delay chain setting may be able to provide a working CLK/DQS relationship. In such scenarios, memory controller 28 may be adjusted to add or subtract a desired number of clock cycle delays (e.g., by adjusting the amount of time write data is held before being sent to each memory group). For example, memory controller 28 may increment the write latency (while DQ/DQS phase and delay settings are swept at each write latency setting) until the left edge is found.

In scenarios in which DQ/DQS skew is substantial (DQS is not aligned to the center of the DQ window), write leveling calibration may be unsuccessful. In such scenarios, the write data registers (e.g., circuits 84, 86, and 88 in FIG. 5) can be "primed" so that the relationship between DQ and DQS does not affect write margin. At a first step, zeroes may be repeatedly written to a selected memory group to ensure that the memory cells in the selected memory group is storing zeroes. At a second step, ones may be presented to write I/O circuits 82 without toggling DQS. This step ensures that the write data registers are all storing ones while the memory cells in the selected memory group is still storing zeroes.

At a third step, a single write is performed by allowing DQS to toggle at a given delay setting (i.e., a given combination of write latency, phase setting, and delay setting). If the given delay setting is a working delay setting, a burst of ones should be written into the selected memory group and can be detected using a subsequent read operation. These steps can be repeated to determine the left and right edges of write data valid window ΔTwv even if DQ/DQS skew is substantial.

Figure 13:
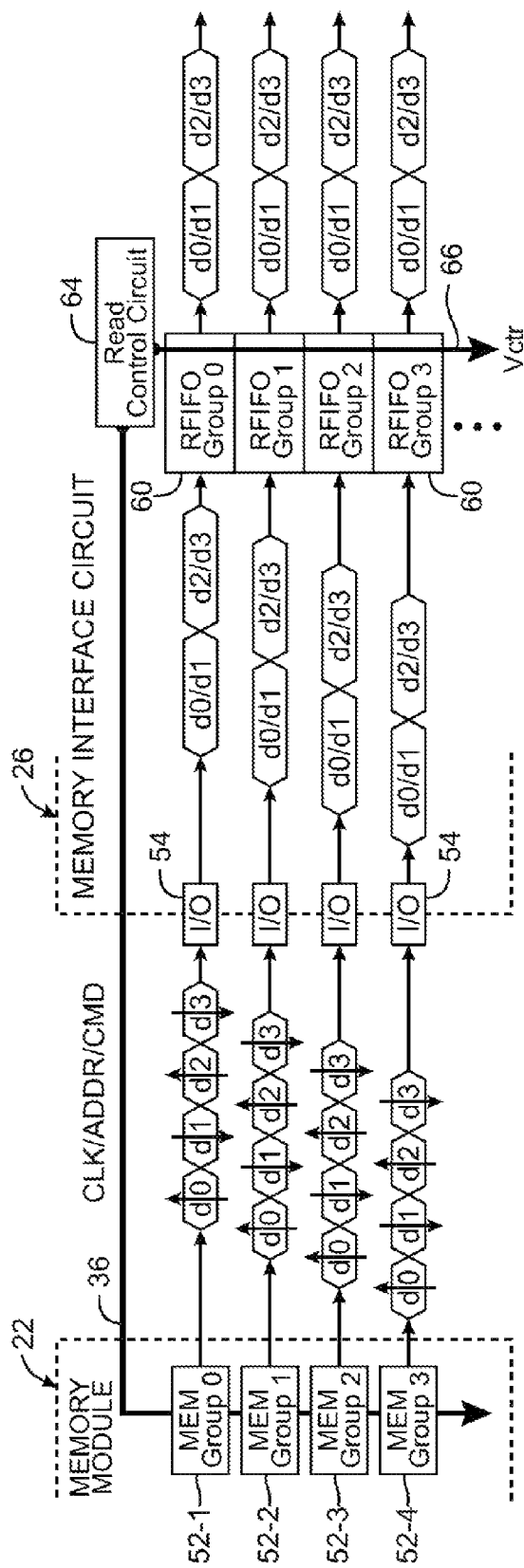
FIG. 13 is an exemplary diagram showing data skew during memory read operations in accordance with an embodiment of the present invention.

FIG. 13 illustrates a scenario in which read latency tuning can be implemented. As shown in FIG. 13, data read out from memory group 52-1 may arrive at memory interface circuit 26 arriving at the other memory groups, because memory group 52-1 is the first to receive CMD. Data from memory group 52-2 may arrive second, whereas data from memory group 52-3 may arrive third, etc. Read-sync buffers (sometimes referred to as read-synchronization first-in-first-out (FIFO) circuits) may therefore receive the DQ/DQS signals the respective memory groups at different times. FIFOs 60 may store (buffer) received data for a period of time adjusted using read latency control signal Vctr before outputting data to memory controller 28. Read latency tuning serves to reduce amount of read latency while still enabling data to be read out properly.

Figure 14:
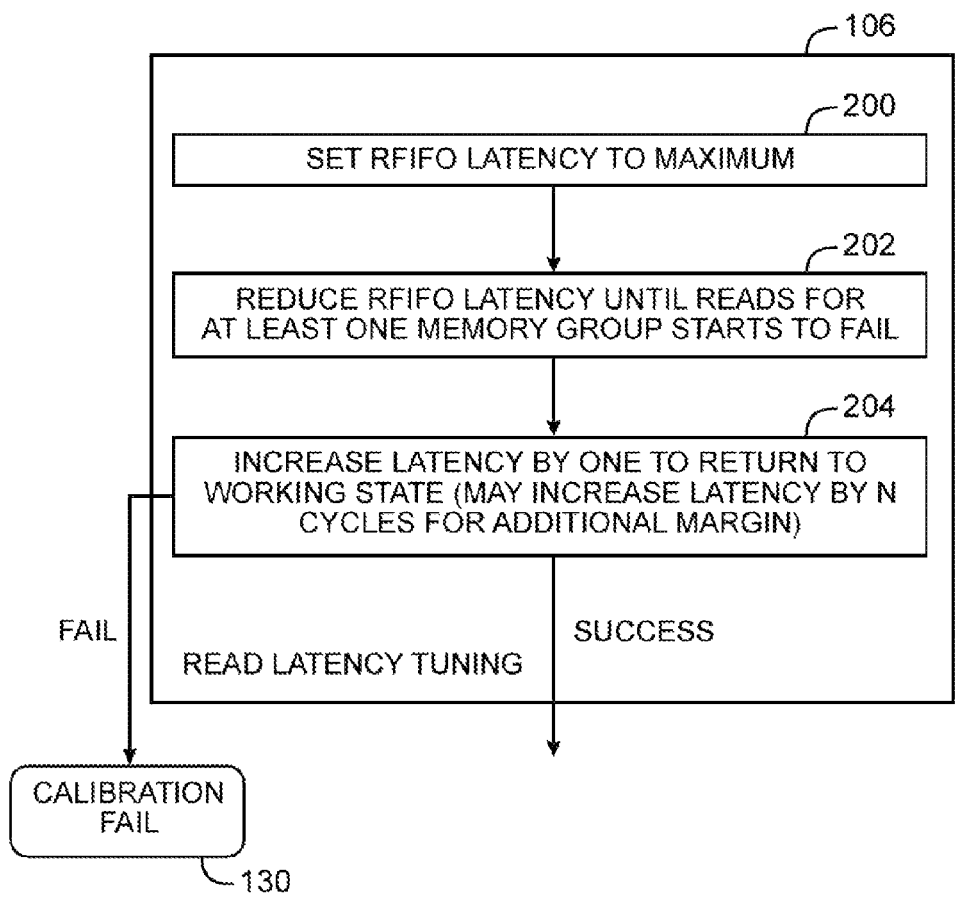
FIG. 14 is a flow chart of illustrative steps involved in performing read latency tuning in accordance with an embodiment of the present invention.

FIG. 14 shows steps involved in read latency tuning (step 106 in FIG. 6). At step 200, the read FIFO latency is tuned to the highest setting (e.g., buffer 60 is configured to hold data for as long as possible without outputting data). At step 202, the read FIFO latency is reduced gradually until reads for at least one memory group starts to fail. The highest read FIFO latency for which at least one memory group fails to read properly may be defined as a minimum read latency. At step 204, the read FIFO latency is increased from the minimum read latency by at least one clock cycle so that the memory groups are reading out data properly. If no read FIFO setting results in a successful read, calibration failure may occur. If desired, the minimum read FIFO latency may be increased by more than one clock cycle, by more than five clock cycles, and by more than ten clock cycles for additional read margin.

Figure 15:
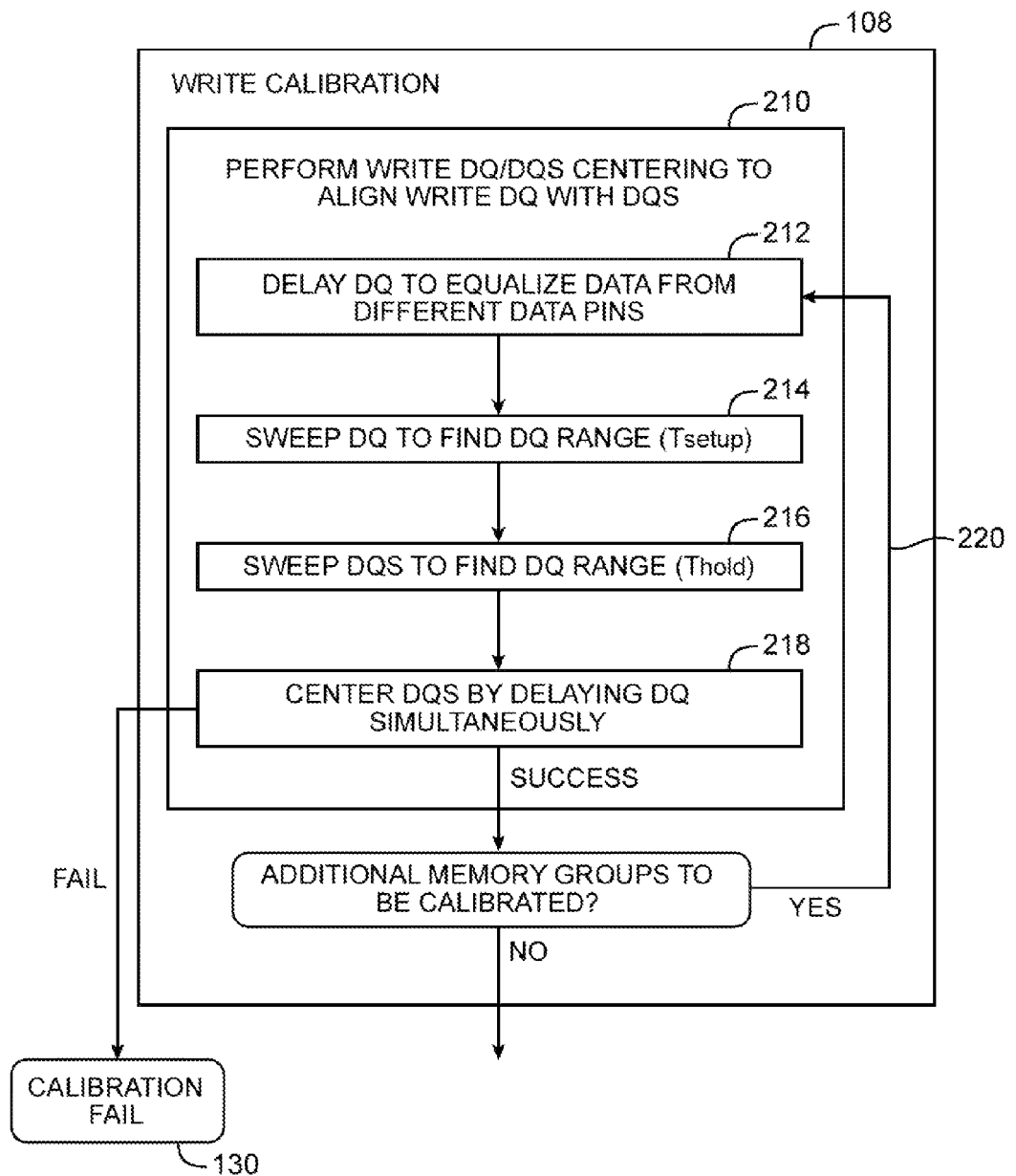
FIG. 15 is a flow chart of illustrative steps involved in performing write calibration in accordance with an embodiment of the present invention.

FIG. 15 shows steps involved during write calibration (step 108 of FIG. 6). As shown in FIG. 15, write calibration operations include performing write DQ/DQS centering 210 to align write DQS to DQ. At step 212, a portion of the DQ signals may be delayed to equalize the data from different data pins (e.g., to align each DQ stream to the latest DQ window). At step 214, DQ may be delayed to determine the DQ range (i.e., to determine setup time). At step 216, DQS may be momentarily delayed to determine the DQ range (i.e., to determine hold time). At step 218, each of the DQ signals may be delayed by some common amount of time to center DQ/DQS for maximum setup and hold margins. If there are additional memory groups to be calibrated, processing may loop back to step 212, as indicated by path 220. If no delay setting is able to determine the DQ/DQS range, calibration failure may occur. Other suitable adjustments described in connection with FIG. 11 may also be applied to write calibration 108, if desired.

In another suitable arrangement, calibration may be performed for the system control signals provided over path 36. For example, it may be desirable to perform command calibration by adjusting phase settings associated with the command bits to ensure that signals CMD are properly aligned to signal CLK. It may also be desirable to perform address calibration by adjusting phase settings associated with the address bits to ensure that signals ADDR are properly aligned to signal CLK.

Figure 16:
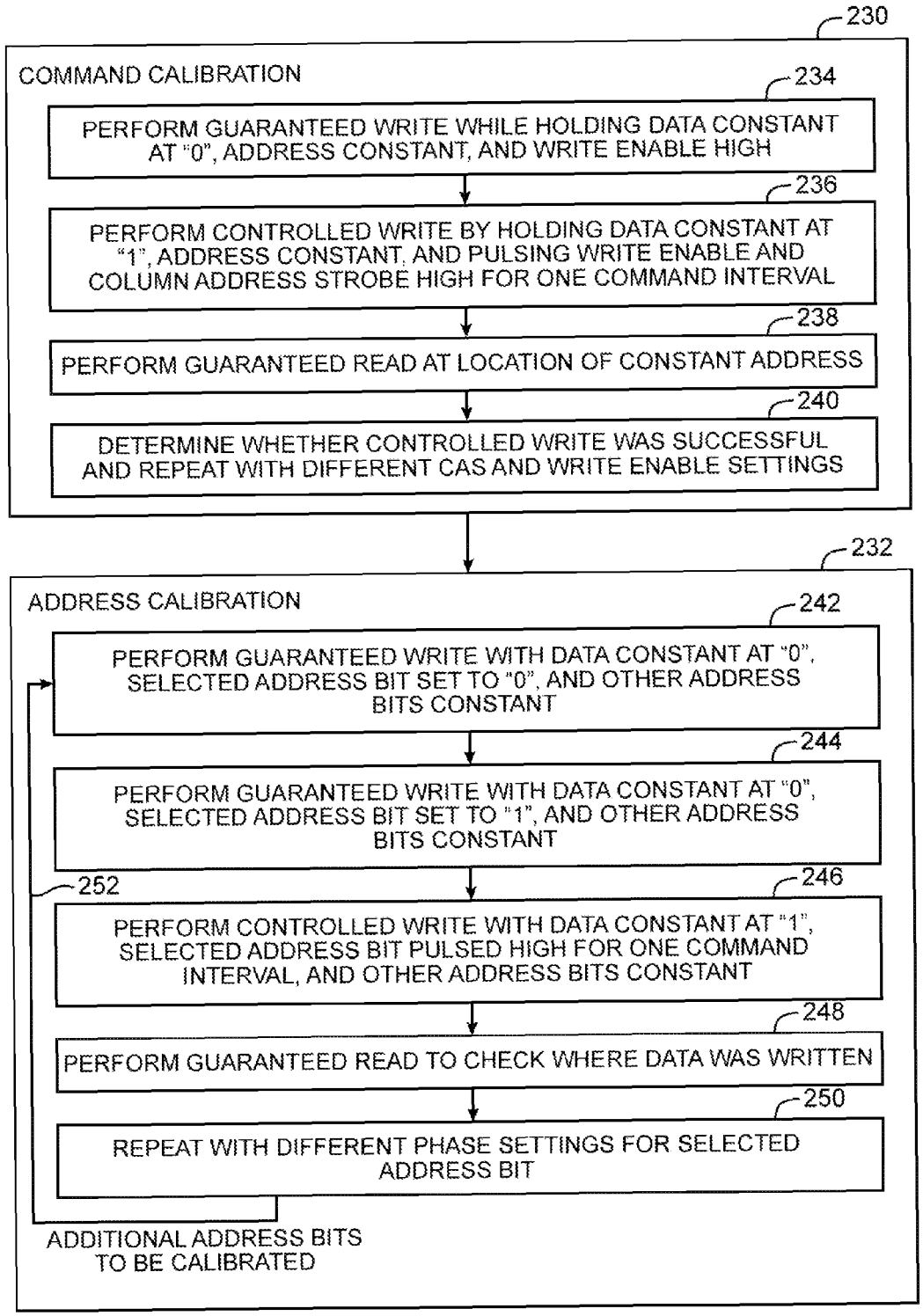
FIG. 16 is a flow chart of illustrative steps involved in performing system control signal calibration in accordance with an embodiment of the present invention.

FIG. 16 shows illustrative steps involved in performing command signal calibration 230 and address signal calibration 232. At step 234, a guaranteed write (e.g., a series of back-to-back writes while data is held constant) may be performed while holding data constant at zero, while the address bits are constant, and while write enable signal is asserted. At step 236, a controlled write may be performed while holding data constant at one, while the address bits are unchanged, and by pulsing the write enable signal and column address strobe (CAS) high for one command interval (e.g., for one clock cycle).

At step 238, a guaranteed read (e.g., a series of back-to-back reads at one selected address) may be performed at the location of the constant address. If the controlled write was successful, the guaranteed read will output a logic one. If the controlled write was unsuccessful, the guaranteed read will output a logic zero. Steps 234, 236, and 238 may be repeated for different CAS and write enable phase/delay settings to determine a suitable working range within which CAS and the write enable signal should be centered (step 240).

FIG. 16 also shows illustrative steps involved in performing address signal calibration 232. At step 242, a guaranteed write may be performed with data held constant at zero, with an address bit under calibration (ADDRUC) set to "0," and with all other address bits held constant. At step 244, a guaranteed write may be performed with data held constant at zero, with the ADDRUC set to "1," and with all other address bits held constant. Performing guaranteed writes in step 242 and 244 serves to load a series of zeroes into first and second address locations in memory, respectively.

At step 246, a controlled write may be performed while data is held constant at one, while the ADDRUC is pulsed high for one command interval, and while the other address bits are kept constant. At step 248, a guaranteed read is performed to check to which address location the data value of one was written. If a "1" is read out from the first address location, the current phase setting of the ADDRUC is not within the desired working range. If a "1" is read out from the second address location, the current phase setting of the ADDRUC is within the desired working range. Steps 242, 244, 246, and 248 may be repeated using different phase settings for ADDRUC to determine a suitable working range within which the ADDRUC pulse should be centered (step 250). Processing may loop back to step 242 to calibrate another address bit, as indicated by path 252.

The steps illustrated in FIG. 16 are merely illustrative. If desired, step 232 may be performed prior to step 230. If desired, the guaranteed reads and writes may be performed at reduced clock speed to improve memory write-ability and read-ability.

Calibration steps described in connection with FIGS. 6-16 may be used to calibrate a variety of systems based on different memory interface protocols (i.e., the calibration steps may be applied to calibrate memory that is compliant with multiple communications protocols). For example, these calibration techniques may be applied to systems supporting double data rate (DDR), quad data rate (QDR), reduced-latency dynamic RAM, and other memory communications protocols.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for calibrating memory interface circuitry, the method comprising:
    performing a memory interface calibration operation for the memory interface circuitry to communicate with memory, wherein said memory is compliant with a first communications protocol and a second communications protocol, and wherein performing the memory interface calibration operation comprises:
        outputting a system clock, write data signals, and an associated write data strobe signals with the memory interface circuitry to the memory during write operations;
        performing a write leveling operation for aligning edges of the associated write data strobe signals to edges of the system clock; and
        performing a write calibration operation for centering edges of the associated write data strobe signals with respect to the write data signals for having equal setup and hold times.

2. The method defined in claim 1, wherein performing the memory interface calibration operation comprises performing a read calibration operation.

3. The method defined in claim 2, wherein the memory is operable to send read data signals and associated read data strobe signals to the memory interface circuitry during the read calibration operation, wherein the memory interface circuitry includes a latching circuit operable to receive the read data signals and the associated read data strobe signals, and wherein performing the read calibration operation comprises:
    performing a data strobe enable calibration operation to remove spurious signals from the associated read data strobe signals arriving at the latching circuit.

4. The method defined in claim 3, wherein performing the read calibration operation further comprises:
    centering edges of the associated read data strobe signals with respect to the read data signals for having equal setup and hold times.

5. The method defined in claim 1, wherein the memory interface circuitry further comprises a read buffer circuit, and wherein performing the memory interface calibration operation further comprises:
    storing at least a portion of read data signals in the read buffer circuit; and
    performing a read latency tuning operation to output the stored read data after a calibrated read latency period.

6. The method defined in claim 1, wherein performing the memory interface calibration operation comprises:
    performing a read calibration operation before performing the write leveling operation and before performing the write calibration operation; and
    performing the write leveling operation before performing the write calibration operation.

7. The method defined in claim 1 further comprising:
    outputting a system clock, an address signal, and a command signal with the memory interface circuitry to the memory; and
    performing address calibration by adjusting phase settings associated with the address signal to ensure that the address signal is properly aligned to the system clock.

8. A method for calibrating memory interface circuitry, the method comprising:
    at the memory interface circuitry, receiving data signals and associated data strobe signals from memory; and
    performing a data strobe enable calibration operation with a data strobe shift and enable circuit to remove spurious signals from the associated data strobe signals arriving at a capture circuit through the data strobe shift and enable circuit.

9. The method defined in claim 8 further comprising:
    loading a predetermined data pattern into the memory by toggling additional data strobe signals while the predetermined data pattern includes signals having identical data values.

10. The method defined in claim 8 further comprising:
outputting a system clock, write data signals, and associated write data strobe signals with the memory interface circuitry to the memory during write operations; and
performing a write leveling operation, wherein the write leveling operation aligns edges of the associated write data strobe signals to edges of the system clock.

11. The method defined in claim 10, wherein the write leveling operation is performed after the data strobe enable calibration operation.

12. The method defined in claim 8 further comprising:
centering edges of the associated data strobe signals with respect to the data signals for having equal setup and hold times after performing the data strobe enable calibration operation.

13. The method defined in claim 12, wherein centering the edges of the associated data strobe signals with respect to the data signals comprises:
delaying at least some of the data signals with respect to an edge of the associated data strobe signals to equalize data signal arrival times at the memory interface circuitry;
during a first time period, delaying the data signal with respect to the edge of the associated data strobe signals to determine the setup time;
during a second time period, delaying the associated data strobe signals with respect to the data signals to determine the hold time; and
delaying the data signals with respect to the edge of the associated data strobe signals to ensure that the setup and hold times are equal.

14. The method defined in claim 8, wherein performing the data strobe enable calibration operation comprises:
receiving a data strobe enable signal with the data strobe shift and enable circuit, wherein the associated data strobe signals has a first edge, wherein the data strobe enable signal has a second edge, and wherein the first edge is centered within a window of time defined by a start time and an end time to remove spurious signals from the associated data strobe signals arriving at the capture circuit through the data strobe shift and enable circuit;
determining a first setting with the memory interface circuitry, wherein the first setting configures the data strobe shift and enable circuit to delay the associated data strobe signals wherein the second edge is aligned to the start time;
determining a second setting with the memory interface circuitry, wherein the second setting configures the data strobe shift and enable circuit to delay the associated data strobe signals wherein the second edge is aligned to the end time; and
using the data strobe shift and enable circuit to delay the data strobe enable signal based on the first and second settings to center the second edge within the window of time.

15. A method for calibrating memory interface circuitry, the method comprising:
outputting a system clock, a data stream, and data strobe signals from the memory interface circuitry to memory, wherein the system clock has a first edge, wherein the data strobe signals has a second edge, wherein the second edge corresponds to a first data signal in the data stream, and wherein the first edge is centered within a window of time having a start time and an end time for properly writing the data stream into the memory; and
determining a setting with the memory interface circuitry, wherein the setting configures an output phase alignment circuit of the memory interface circuitry to delay the data stream and the data strobe signals for aligning the second edge to the start time.

16. The method defined in claim 15, wherein the setting comprises a first setting, the method further comprising:
determining a second setting with the memory interface circuitry, wherein the second setting configures the output phase alignment circuit to delay the data stream and the data strobe signals for aligning the second edge to the end time.

17. The method defined in claim 16 further comprising:
using the output phase alignment circuit to delay the data strobe signals based on the first and second settings to center the second edge within the window of time.

18. The method defined in claim 17 further comprising:
centering edges of the data strobe signals with respect to the data stream, wherein setup and hold times are equal after centering the second edge within the window of time.

19. The method defined in claim 18, wherein the data stream comprises one of a plurality of data streams, wherein the data strobe signals has a third edge, and wherein centering edges of the data strobe signals with respect to the data stream comprises:
delaying at least one of the plurality of data streams with respect to the third edge to equalize arrival times of the plurality of data streams at the memory interface circuitry;
during a first time period, delaying at least one of the plurality of data streams with respect to the third edge to determine a setup time;
during a second time period, delaying the data strobe signals with respect to the plurality of data streams to determine a hold time; and
delaying the plurality of data streams with respect to the third edge for having equal setup and hold times.

20. The method defined in claim 1 further comprising:
outputting a system clock, an address signal, and a command signal with the memory interface circuitry to the memory; and
performing command calibration by adjusting phase settings associated with the command signal to ensure that the command signal is properly aligned to the system clock.

* * * * *